United States Patent [19]

Imondi et al.

[11] Patent Number: 6,005,820

[45] Date of Patent: Dec. 21, 1999

[54] FIELD MEMORIES

[75] Inventors: Giuliano Imondi, Rieti; Stefano Menichelli, Rome; Carlo Sansone, Avezzano, all of Italy

[73] Assignee: Texas Instruments Incorporated, Dallas, Tex.

[21] Appl. No.: 08/663,063

[22] PCT Filed: Dec. 7, 1994

[86] PCT No.: PCT/EP94/04071

§ 371 Date: Aug. 29, 1996

§ 102(e) Date: Aug. 29, 1996

[87] PCT Pub. No.: WO95/16266

PCT Pub. Date: Jun. 15, 1995

[30] Foreign Application Priority Data

Dec. 7, 1993 [IT] Italy ................................ RM93A0810

[51] Int. Cl.⁶ .................................................. G11C 13/00
[52] U.S. Cl. ................ 365/230.01; 365/78; 365/189.04; 365/189.12; 365/230.03; 711/109; 711/169
[58] Field of Search ............................. 365/189.04, 219, 365/230.03, 195, 230.01, 51, 63; 711/169

[56] References Cited

U.S. PATENT DOCUMENTS

| | | |
|---|---|---|
| 3,623,020 | 11/1971 | Mao . |
| 3,898,632 | 8/1975 | Spencer . |
| 3,967,251 | 6/1976 | Levine . |
| 4,914,630 | 4/1990 | Fujishima et al. .................. 365/189.04 |
| 5,027,318 | 6/1991 | Wischermann . |
| 5,200,925 | 4/1993 | Morooka .................. 365/219 |
| 5,371,714 | 12/1994 | Matsuda et al. .................. 365/230.03 |
| 5,394,366 | 2/1995 | Miyamoto .................. 365/195 |
| 5,469,400 | 11/1995 | Yamano .................. 365/230.01 |
| 5,537,346 | 7/1996 | Seo et al. .................. 365/51 |
| 5,621,679 | 4/1997 | Seo et al. .................. 365/63 |

OTHER PUBLICATIONS

Patent Abstracts of Japan, vol. 6 No. 13 (p.–99) [891], Jan. 26, 1982 & JP–A–56 137581 (Toshiba), Oct. 27, 1981, see abstract.

*Primary Examiner*—Tod R. Swann
*Assistant Examiner*—Fred F. Tzeng
*Attorney, Agent, or Firm*—Bret J. Petersen; Richard L. Donaldson

[57] ABSTRACT

A field memory having a distributed architecture is disclosed and in particular a memory arranged in block, wherein each block stores a bit or bits of said word, said bits having a predetermined position within said word. The distributed architecture improves the transfer of data between the input/output buffers and the internal registers of the memory. A data cache and an improved input erasable realisation are also disclosed.

13 Claims, 12 Drawing Sheets

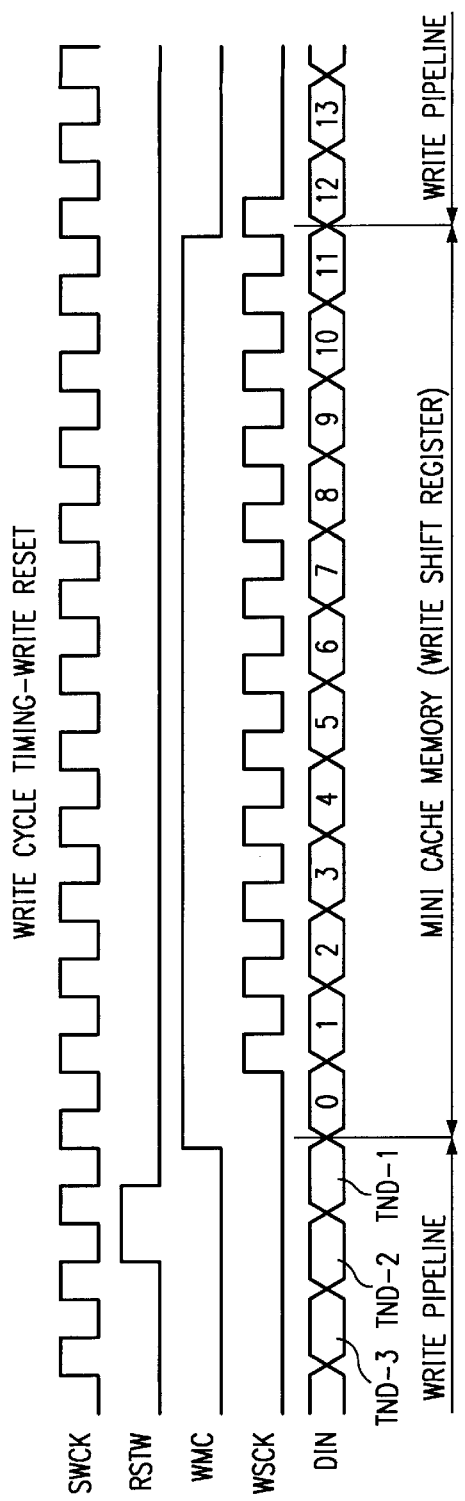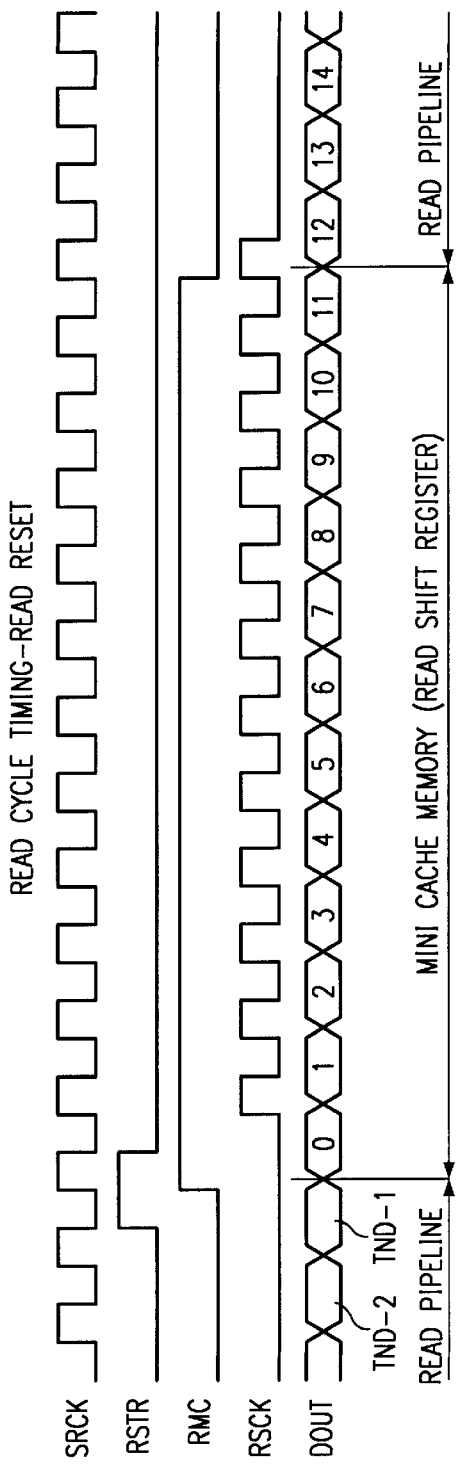
FIG. 7B
FIG. 7C

FIELD MEMORIES

This invention relates to field memories (FMEM) including those using, for example, dynamic random access memory (DRAM) technology.

A dynamic memory cell is one which stores data as charge, or absence of charge, on a capacitor. Typically the cell isolates the capacitor from the data (bit) line with a transistor switch such that when no read or write operation is required there is essentially no power demand to maintain the data. However, normal leakage normally requires that the charge be periodically restored. This periodic restoration of the charge is known as the refresh process.

A Field Memory (FMEM) is sequential-access memory, of the First-In First-out (FIFO) type. Currently, the central memory of a FMEM has a typical capacity of one to four mega-bit (1–4 Mb) and, to achieve high integration of densities, consists, for example, of an array of dynamic cells derived directly from DRAM technology.

FMEM's are devices in which the read and write operations may be asynchronous. Two distinct uncorrelated clocks may be used. Alteratively, the read and write operations may be synchronised using a single clock.

A very important feature of all FMEM is their high operating speed with clock frequencies between 30 MHz and 50 MHz, for example.

The technology employed has a determining influence on the general architecture of FMEM, in particular on the physical arrangement of the registers within the device. The present invention provides an improved field memory having an improved architecture. Such an improved architecture results in a more efficient structure and layout on integrated circuit which forms the device.

The present invention also provides an improved implementation of the input enable function.

The present invention yet further provides a cache arrangement for improved access.

According to the present invention in one aspect thereof, there is provided a field memory arranged in blocks to store data and wherein each block stores a bit or bits of said word, said bits having a predetermined position within said word.

A field memory in accordance with the present invention may be described as a distributed architecture, as the bits of the word are "distributed" among the blocks of the array. Distributed architecture is more efficient than conventional technology in solving the problem of transferring data between the input/output (I/O) buffers and the internal registers of the buffer.

In one embodiment of the present invention, the field memory is divided into blocks having registers, with each bit uniquely associated with one register bank.

In order that features and advantages of the present invention may be more fully appreciated, embodiments will now be described by way of example only and with reference to the accompanying drawings of which:

By way of example, the embodiments described refer to field memories employing in its original form conventional technology, such as 4 Mb DRAM technology. The concept of distributed architecture, would however, benefit other applications and technology. For example, both current and future 16 Mb DRAM technology. This embodiment illustrates the distributed architectural solution as applied to the problem of transferring data between the I/O buffers and the registers. The architecture described solves the transfer problem more efficiently than prior technology.

Figure 1A:
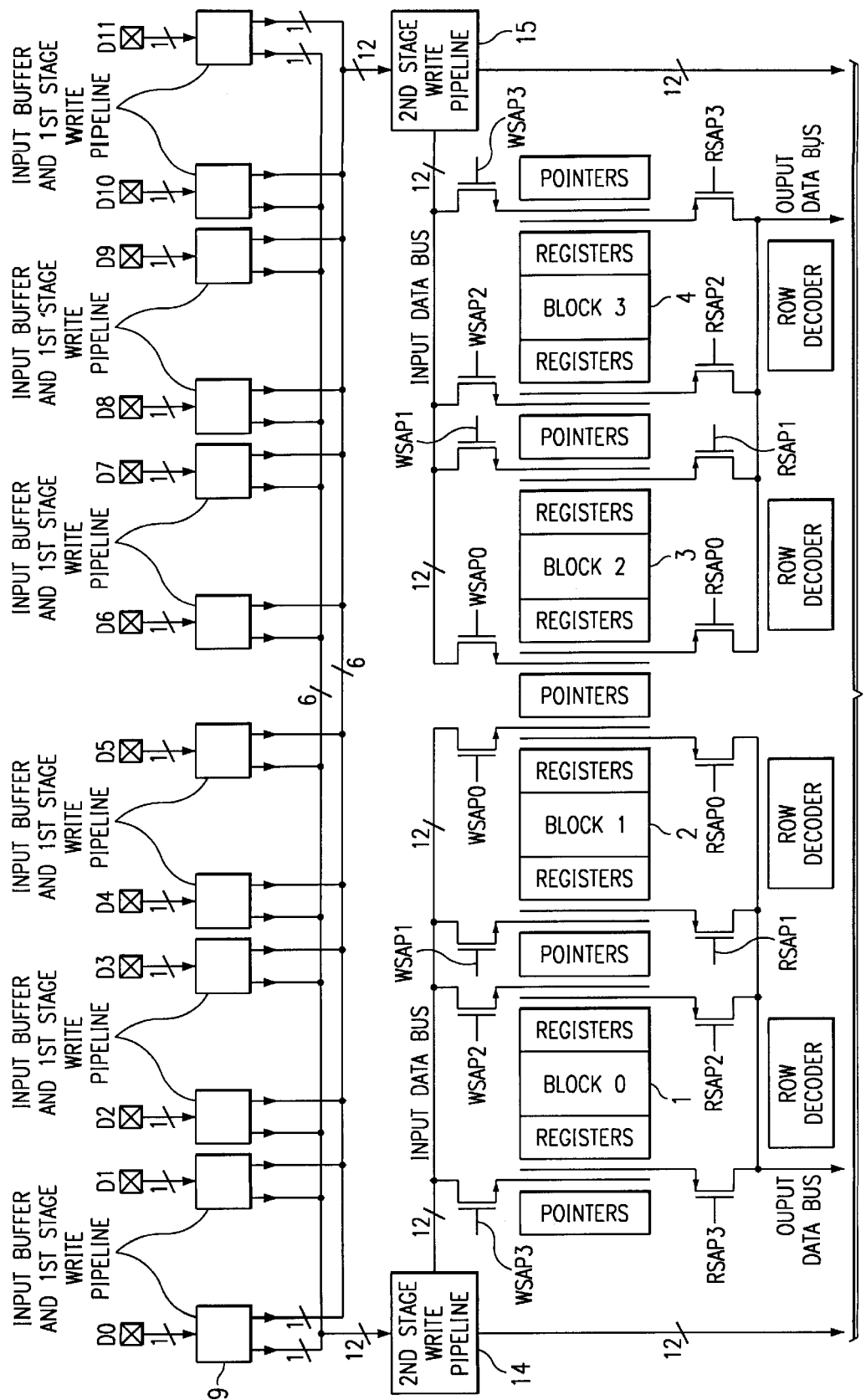
FIG. 1 is an architectural diagram of a field memory device.
Figure 1B:
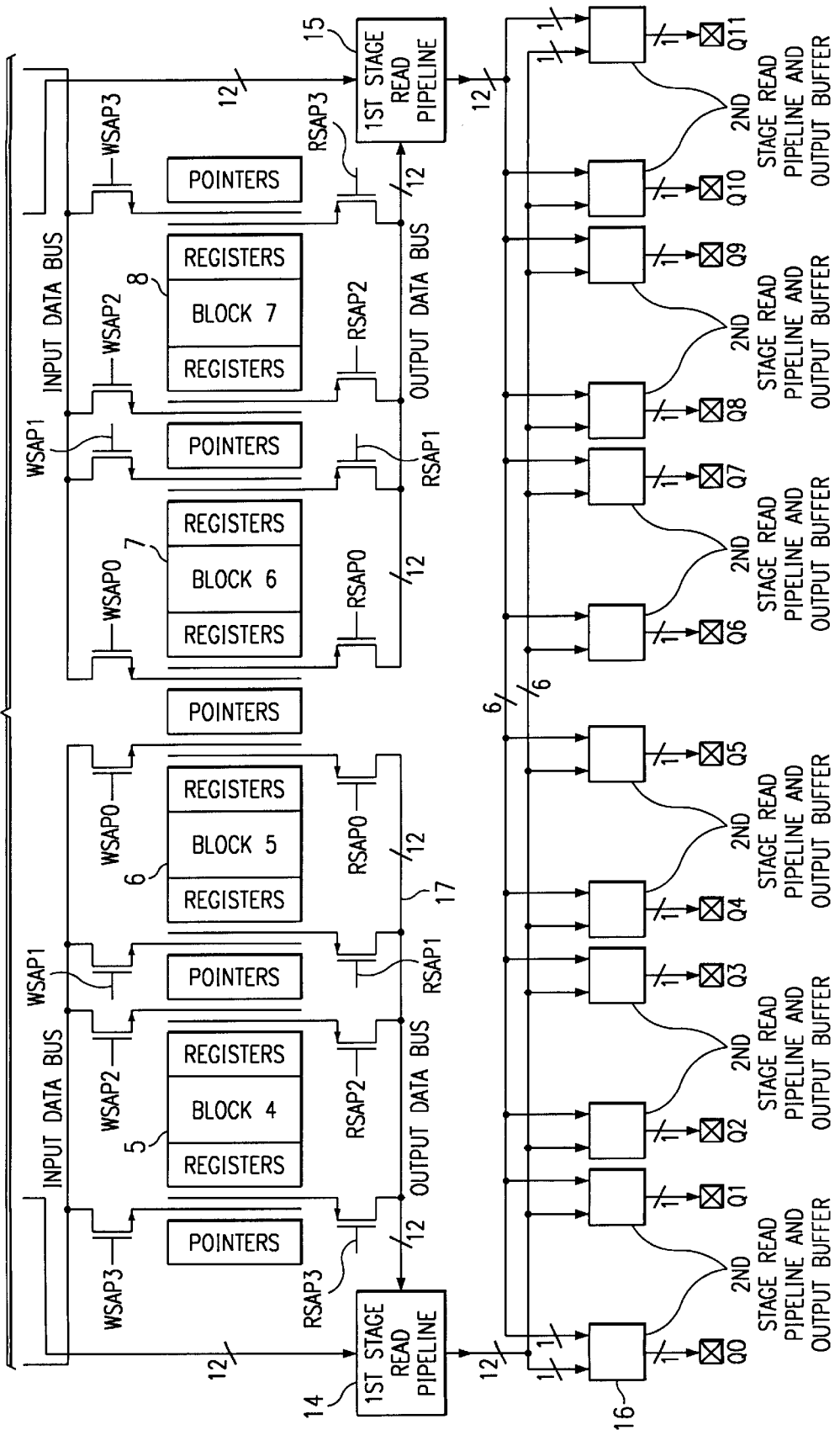
Figure 2:
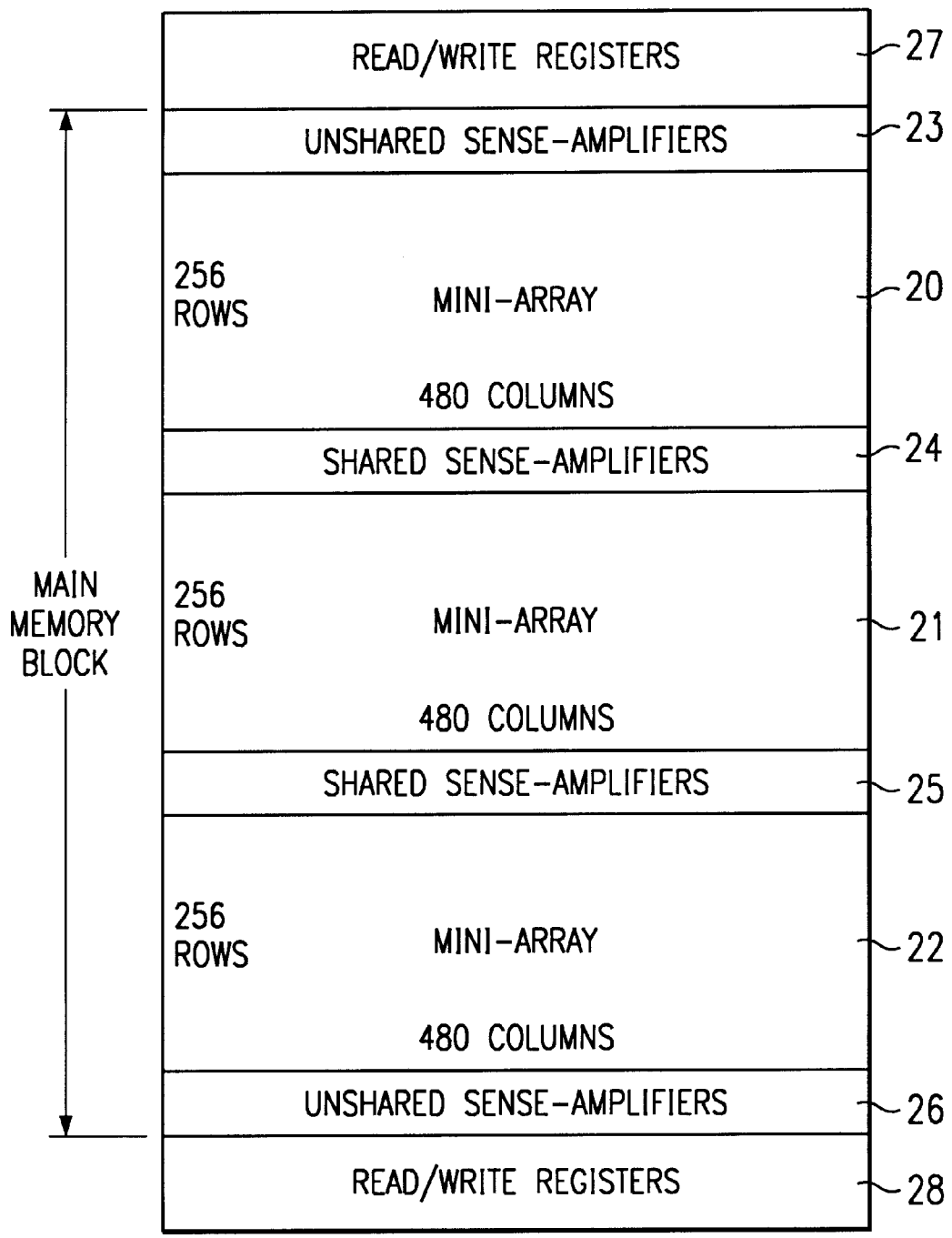
FIG. 2 is a diagram to show the arrangement of one block of central memory.

The Field Memory, shown as a block diagram in FIG. 1, has a central memory which is sub-divided into 8 blocks, numbered 1 to 8 (FIG. 1). Each block, as shown in FIG. 2, contains three mini-arrays (20,21,22) with associated sense-amplifiers (23,24,25,26). The outer mini-arrays are flanked by read/write registers (27,18). In total there are 16 banks of registers (2×8 blocks). In one embodiment each mini array is arranged as 256×480 columns (122,880 bits).

Each bank contains a sufficient number of registers, for both read and write modes, to store five words. This gives a total capacity for the buffer memory of 80 words (16×5).

The 12 bits of a word are stored in adjacent registers, which require input and output buses (respectively 16,17), both twelve bits wide, beside each bank of registers (FIG. 1). These buses have buffers on each inputs, such as buffer 9 having an input pad DO. The outputs are also buffered (such as by buffer 16).

The register banks are addressed using selectors which select 4 banks out of the 16. These selectors are identified, in FIG. 1, as SAPs. The SAPs are suffixed from 0 to 3 and prefixed W to indicate write mode such as SAP10, or R for read mode such as SAP10. Beside each register bank are pointers which select one of the five word options, such as pointer 12.

Using two pipelines (14,15), one for write and one for read mode, four words are addressed in parallel at a time. The write pipeline transfers data from the input buffers to the registers in parallel, thereby reducing the clock frequency by a factor of four. The read pipeline serialises the data transferred from the registers to output buffers, increasing the clock frequency by a factor of four.

The number N of words involved in each memory cycle, either in write or read mode, defines a time window. This window is expressed as N (the Number of words involved)× MCT (Minimum Cycle Time). The MCT is the time, within which all 5 possible requests for access to the central memory can be met. These request for access are; "Reset Write", "Sequential Write", "Reset Read", "Sequential Read" and "Refresh".

Time sequencing of the central memory operations, and therefore "requests" are managed by an "arbiter"—the section of a multiprocessor network's operating system capable of resolving simultaneous system-resource requests.

Each and every access to the memory array involves all the cells in the row being addressed. Although only a quarter of these cells are actually involved in the read or write operation. All cells are involved because block selectors select 1 sense-amplifier out of the 4 available, and connect it to the local register. The row addresses are contained in 3 counters, identified on FIG. 1 as "write row counter", "read row counter" and "refresh row counter". The refresh row address is incremented at every refresh cycle. The read row address is incremented every 4 read cycles and similarly, the write row address is incremented every 4 write cycles, as a result of module 4 column addressing and sequential access.

It will be observed that the architecture described thus far, takes no account of the "position" attribute of bits in an individual word. With reference to FIG. 1, there is no relation between the positions of the I/O pads (D,Q) and the position of the registers where the bits are stored. During transfer between the pipeline and the registers, the bits of a word are grouped into packets of twelve and transferred, regardless of their origin and/or destination, via a network of I/O data buses, in which each bus has a width of twelve.

By contrast, in accordance with the present invention it is possible to associate the bits of the individual word with the register banks, connect the pipelines in "local model" and considerably simplify the mechanism for addressing registers by for example, in the preliminary stage of planning the layout, taking account of the position of the registers in relation to the position of the I/O pads.

To apply this principle within a distributed architecture efficiently, it is to be preferred if the number of blocks in the central memory is a function of the number of bits in the word. Conventional technology with eight memory blocks (FIG. 1) would accord well with words of length 8 or 16, for instance. However, 8 memory blocks are ill-suited to words with a length of 12, as in the architecture described.

Figure 3A:
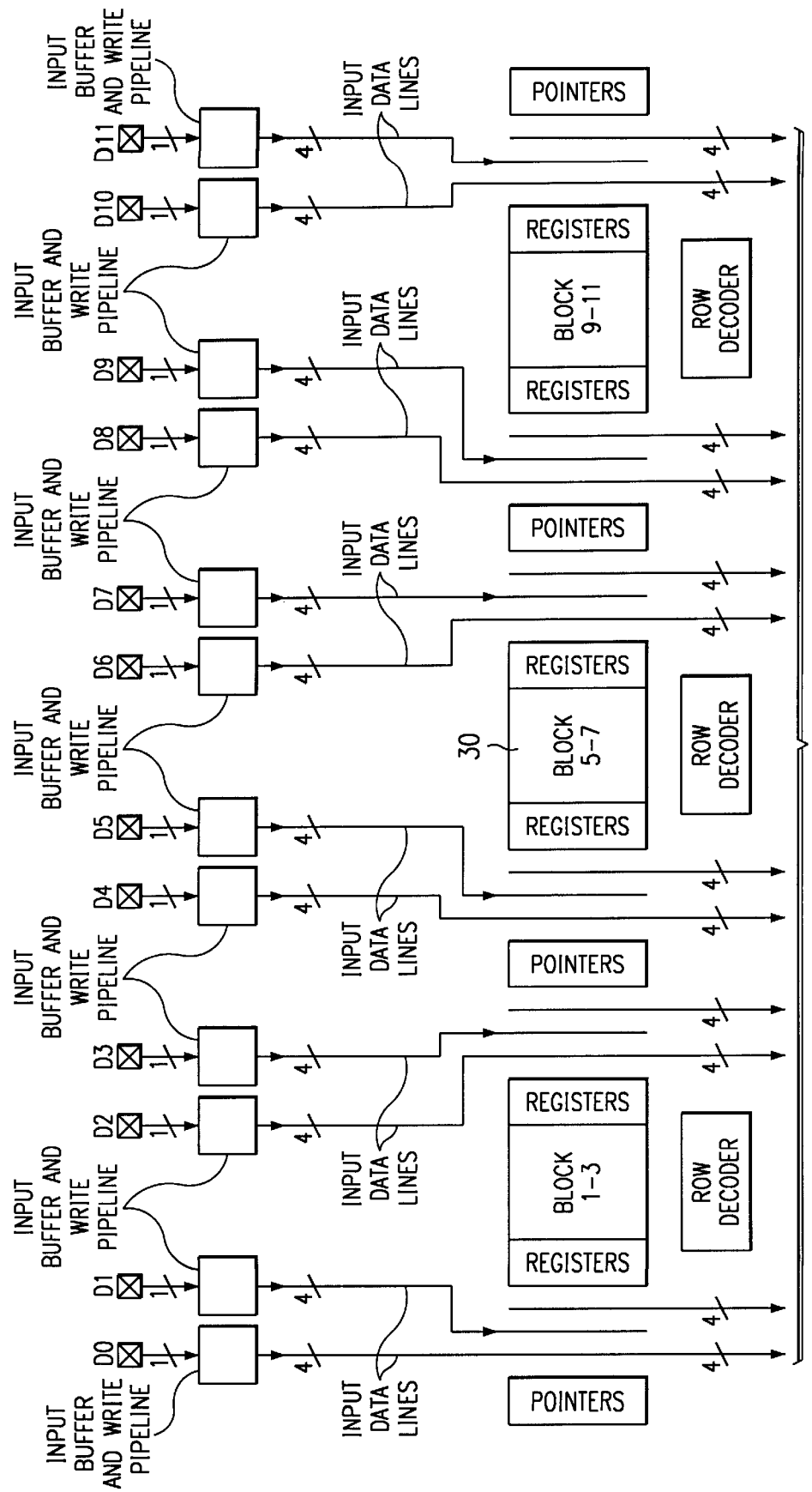
FIG. 3 is an architectural showing distributed architecture.
Figure 3B:
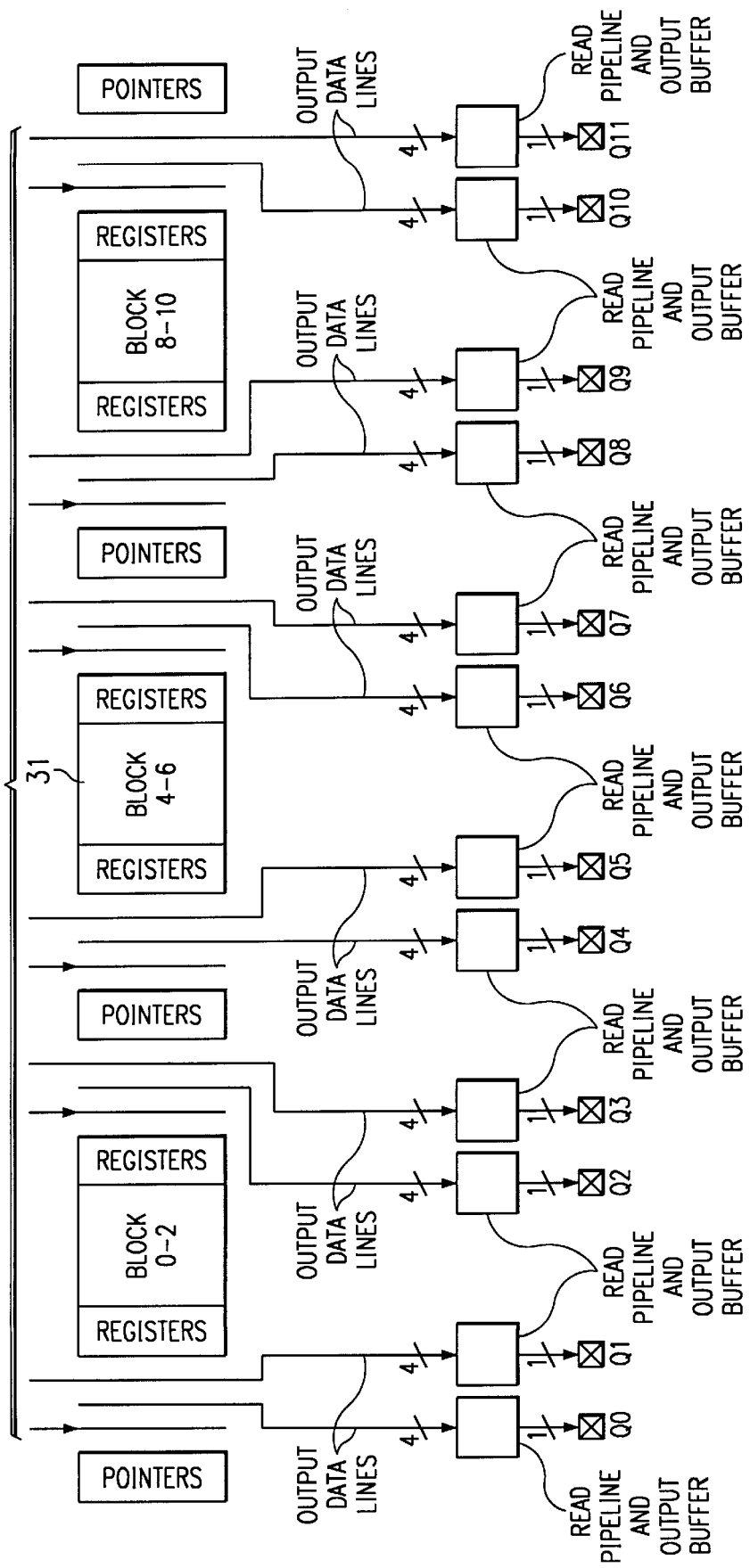

If the word length is fixed, in this example as 12, the central memory should be reorganised into either 12 or 6 blocks. The number of blocks becoming a function of the number of bits in the word. Utilising a 6 block architectural solution, according to this embodiment, the "distributed" architectural layout shown in FIG. 3 is obtained.

In the improved layout (FIG. 3), every bit of the word is uniquely associated with one register bank. For instance, in block 5-7 (30) are stored only the fifth and seventh bits of the word. Likewise, block 4-6 (31) stores just the fourth and sixth bits of the word. The "local" connections shown in FIG. 3 are achieved whilst maintaining parallelism of access to the registers equal to four in the embodiment. However, the network of I/O data lines of this circuit (FIG. 3), based on the present invention is considerably simplified when compared with that of (FIG. 1). For instance, the number of lines passing besides the register banks has been reduced by 50%; the horizontal I/O data buses being eliminated.

Leaving the capacity of the buffer memory unchanged (80 words), the mechanism for addressing registers is enormously simplified, due to the elimination of one addressing level, ie: the level formerly controlled by the SAP selectors.

Figure 4A:
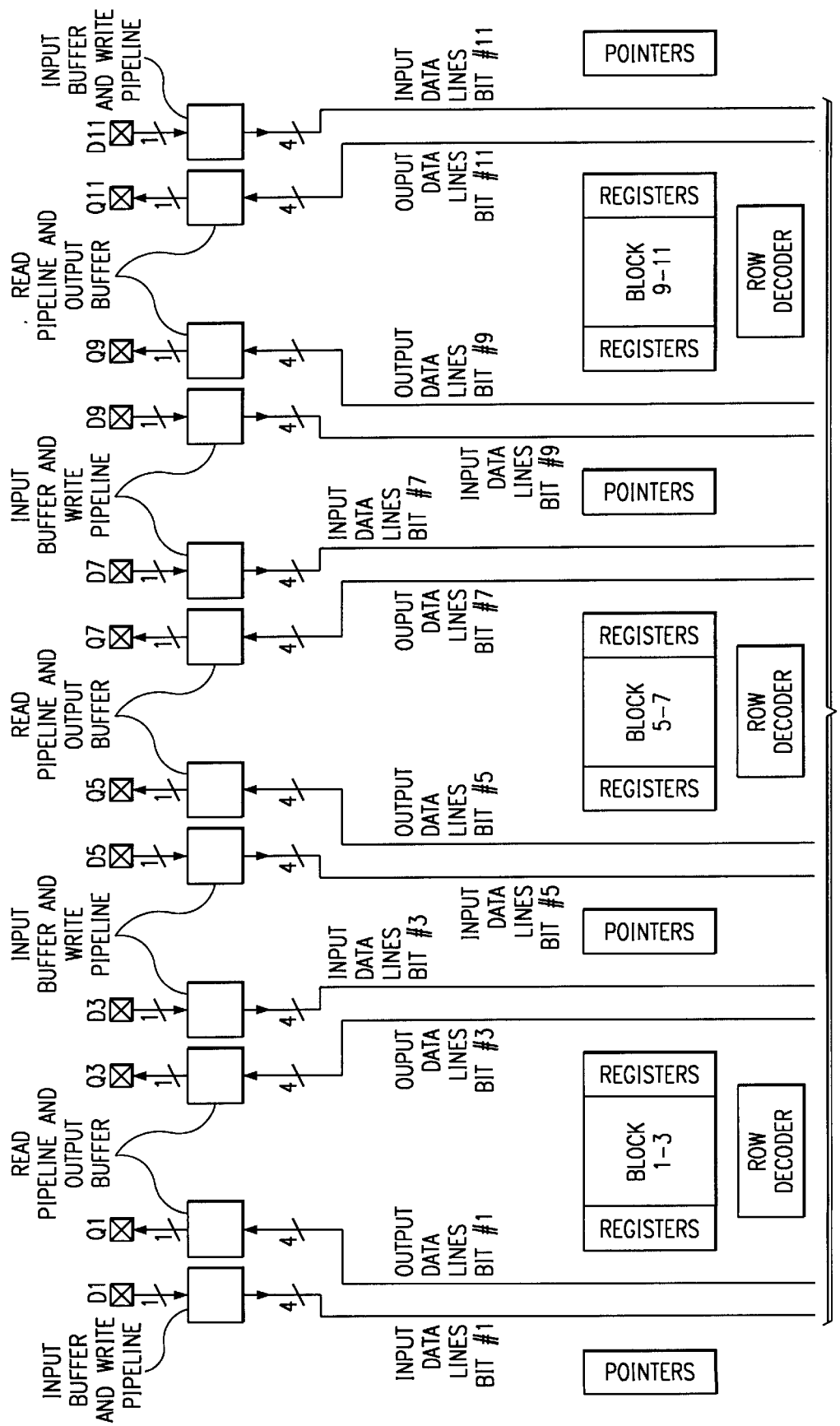
FIG. 4 is an architectural diagram showing a further example of an embodiment employing distributed architecture.
Figure 4B:
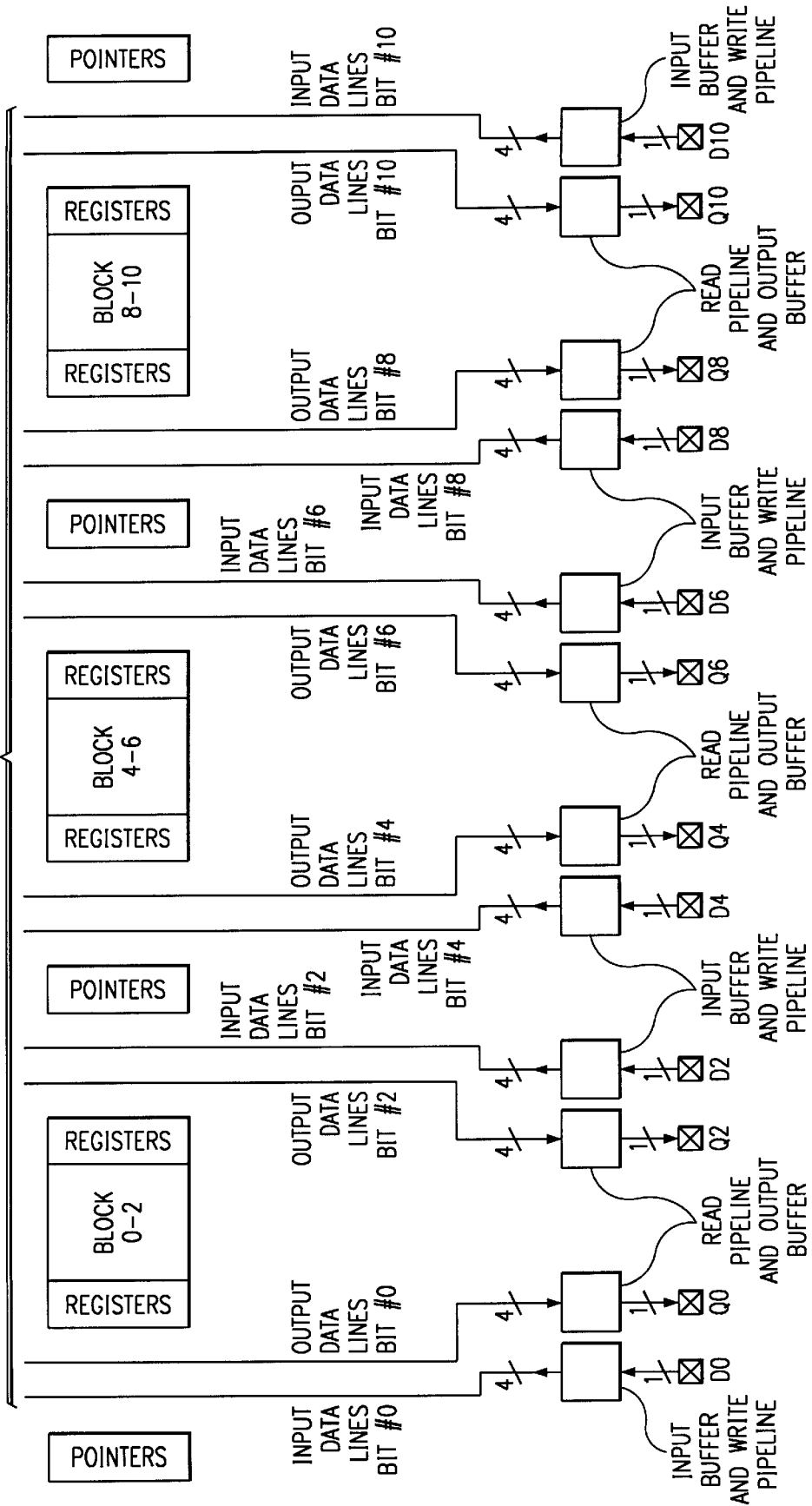

In a further embodiment of this invention by changing the arrangement of the pads, it is possible to obtain the layout shown in FIG. 4. Where the configuration of the I/O data lines is even more efficient than achieved in FIG. 3.

Yet a further development of the circuit shown in FIG. 4 would derive another layout for devices which have their pads arranged horizontally along a central line, suitable for example for a lead over chip arrangement.

It is of note that the layouts shown in both FIGS. 3 and 4, parallelism of registers of possibly less than 4 is likely to be sufficient, because the I/O operations are extremely localised by the layout design, they are therefore less penalised by the speed of parasitic components necessitated by routing.

In the examples, for simplicity, as within FIG. 1 the presence of an Input Enabler (IE) has not been described. Indeed some FMEMs do not have IE at all.

Input Enable (IE) is the signal which establishes whether, or not, the word currently in input is to be stored in memory, or if the pre-existing item of data is to be left in place unchanged. Known as "masking", this process is performed at "registers level" in the example circuit (FIG. 1). This means that the IE information bit, associated with every word in input, is distributed wherever one, or more bits of the word itself are stored. In the arrangement of FIG. 1, for the purpose of this description, the IE can be considered as the thirteenth bit of the word in input. Should it be considered desirable to take account of the "effective thirteenth bit" this can be achieved in FIG. 1 by increasing the width of the Input Data Buses from 12 to 13. To take account of the "thirteenth bit" within the architecture shown in FIG. 3 it is necessary to add a further 4 Input Data Lines. These lines can, however, be shared by two adjacent register banks, so the resulting embodiment remains more efficient than the corresponding prior art device.

One solution to obtain an IE function is where, when it is desirable to mask the input and the IE associated with the word therefore has a value of 0, the opening of the transfer gates which connect the word registers to the sense amplifiers is inhibited. By this inhibiting, the write cycle has the effect of writing in the array cells associated with the words which have their transfer gates closed, that is the words with an IE value of 1, simultaneously having the effect of performing a refresh cycle in the cells associated with the masked words, that is the words with an IE value of 0 and whose transfer gates are open.

In devices based on 1 Mb technology, e.g. the TMS1070, the registers of the buffer memory are external to the central memory and located at the periphery. Therefore there are no layout problems, which would otherwise prevent write inhibition, at the level of the transfer gates connecting the word register to the sense amplifiers.

With 4 Mb technology by contrast, the layout of the register occupies, vertically, the space of 4 sense amplifiers. During a memory cycle, every register is connected, via a transfer gate and with appropriate timings, to one of the 4 sense amplifiers associated with it. The selection of the sense amplifiers is controlled by 4 signals, called Block Select (BLKSEL) and shown in FIG. 5, numbered 0,1,2,3 and 4—which open and close the transfer gates, such as gate 50 controlled by block select 0.

If the solution applied for the TMS1070 were considered for the 4 Mb based device, control of the block selectors would need to be differentiated by word, and the control mechanism would have to take account of the IE value in order to inhibit or not, closure of the transfer gates associated with that.

Whilst this would yield an operational device, to be preferred is a methodology for implementing IE that does not significantly impinge on the core design.

The arrangement to be described performs, immediately prior to a write cycle, a read cycle followed by a choice, based on the value the IE, between the new item of data and the last item of data read by the central memory. The data choice, once selected, is immediately written, physically, into the central memory-using a normal write cycle.

This methodology would find immediate application, for instance, in field memories based on 4 Mb technology which having a complex layout regarding sense amplifiers and registers, would otherwise be both difficult and expensive to modify.

Input Enable (IE) is a signal which allocates to each word being input, an information bit to establish whether or not the word is to be written to memory, the data already in memory will be left unchanged. The implementation will now be described with reference to FIG. 5.

Figure 5A:
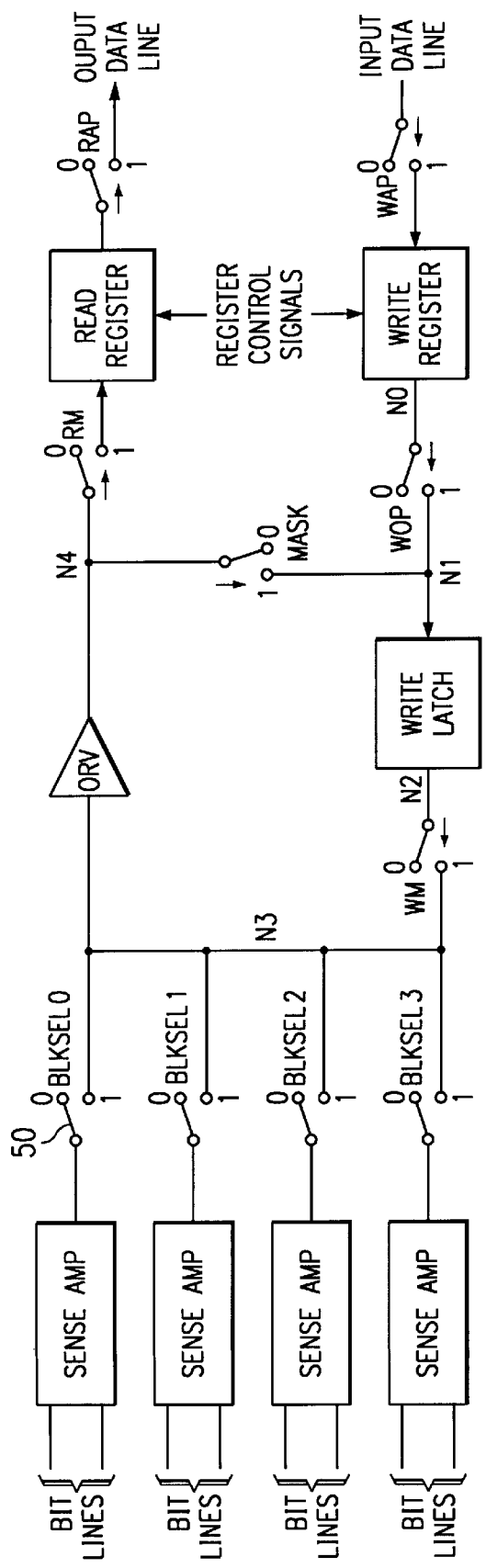
FIG. 5A is a transfer gate arrangement.
Figure 5B:
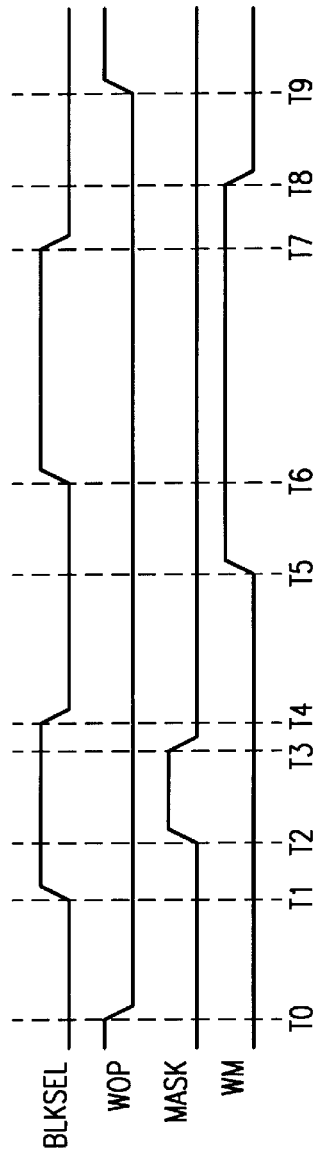
FIG. 5B is a timing diagram.

To facilitate understanding of the operation of the embodiment FIG. 5 is a diagram of a section 5.1 of a register with its associated sense-amplifiers, the timings (3.2) are those which can be expressed from this or similar circuits, being representative of the type.

With every word, in addition to the twelve registers that store the bits, is associated a further register. This, further register stores the value of the IE associated with the word. It is the register which, with appropriate timing, generates the MASK signal.

With reference to FIG. 5, at an instant TO when all the N words of the buffer memory have been written. At this point, the control signal WOP (Write Operation) opens the corresponding switch isolating the "Write Latch" from the "Write Register". At the same time, a write request is sent to the arbiter.

The "Write Latch" holds data relating to the current write cycle, while the "Write Register" is made available for storing the subsequent item of data. As soon as possible, the arbiter initiates the write cycle, consisting of two consecutive cycles, a read cycle and a normal write cycle. The read cycle commences at time T1 when the sense-anplifiers have commuted in response to the data contained in the memory cells. Then, one of the BLKSEL's commutes to 1, and connects to node 4, via the driver (DRV).

On the basis of the IE value, at instant T2 the MASK signal is generated, which controls the switches of the 12 registers associated with the word. If MASK commutates to 1 (continuous line in FIG. 3, IE=0), the signal at node N4 is transmitted to node N1 and is stored in the Write Latch. In this case, the new item of data is replaced by the pre-existing one. If, on the other hand MASK, remains at 0 (broken line in FIG. 3, IE=1), the new data item will be written into the central memory, since the content of the Write Latch remains unchanged. At instant T4, BLKSEL returns to 0 and the Write Latch holds the result of the choice made—on the basis of the MASK value and therefore of the IE—between the new data item and the data item held in the central memory.

It is therefore now possible to begin the normal write cycle that completes the write cycle. At instant T5, the WM (Write Memory) commutates to 1, directing node N3 to the value of the data item stored in the Write Latch.

At instant T6, the BLKSEL, equal to that used for the preceding read cycle, commutes again to 1 and forces the sense amplifier to commutate in accordance with the signal present at node N3. Subsequently, the cells of the array are rewritten, the BLKSEL returns to 0, and the WM commutates to 0. Finally, the WOP signal switches back to 1, indicating the end of the write cycle.

The methodology described above, has the advantage when compared with other methods, of being suitable for a 4 Mb technology device. As in this methodology the duration of the write cycle is double that of a normal write cycle.

In a FMEM based on 4 Mb Dynamic Random Access Memory (DRAM) technology, that thus far described, two pipelines are implemented for input and output operations.

These pipelines introduce delay since in the write mode, after a "write reset", the last input data which is trapped in the write pipeline latches must be written in to the main memory, whether or not the serial write clock is running; in the read mode, after a "read reset", the first data is immediately expected at the output, but may be delayed if the pipeline is empty.

In accordance with a further aspect of the present invention these problematic and undesirable delays can be resolved using a small and fast memory, a mini-cache memory, that functions temporarily on receiving a "reset". The 4 Mb technology typifies conventional technology which would benefit from using small, rapid, dedicated "mini-cache" memory as provided by the present invention.

The embodiment (FIG. 6) has a central memory of 2.9 Mbit which is sub-divided into 8 blocks, numbered 11 to 18 in the diagram. To obtain minimum cycle times (of the order of 25 ms) registers are interposed between the input/output (I/O) buffers (20,21,22,23,24) and the central memory, making it possible to access N words of the array, in parallel, at a time. These registers function as a buffer memory both in write and read modes.

As with the previous embodiment the 8 blocks which constitute the central memory each contain 3 mini-arrays (21,22,23) (FIG. 2) with associated sense-amplifiers, for the outer mini-arrays are flanked by read/write registers (FIG. 2) (25,26), to total 16 banks of registers within the circuit.

8 Blocks×2 banks=16 banks of registers

Each bank contains a sufficient number of registers, both read and write, to store 5 words to give a total capacity for the buffer memory of 80 words N=16 banks×5 words=80 words The register banks are accessed using selectors, which select 4 banks out of the 16 available (FIG. 1), they are identified as "SAP's" suffixed 0 to 3 and prefixed W or R to indicate Write or Read mode. Beside each register bank are pointers, such as pointer 26, which select one of the five word options.

Using two pipelines, one for write mode and one for read mode, 4 words are addressed in parallel at a time. The write pipeline transfers data from the input buffers to the registers, in parallel, thereby reducing the clock frequency by a factor of 4. Conversely, the read pipeline serialises the data transferred from the registers to the output buffers, increasing the effective clock frequency by a factor of 4.

The number N of words involved in each memory cycle, either in write or read mode, defines a time window. This window is expressed as N (the number of words involved)× MCT (Minimum Cycle Time). The MCT is the time, within which all 5 possible requests for access to the central memory can be met. These requests for access are: "Reset Write", "Sequential Write", "Reset Read", "Sequential Read" and "Refresh".

Figure 8:
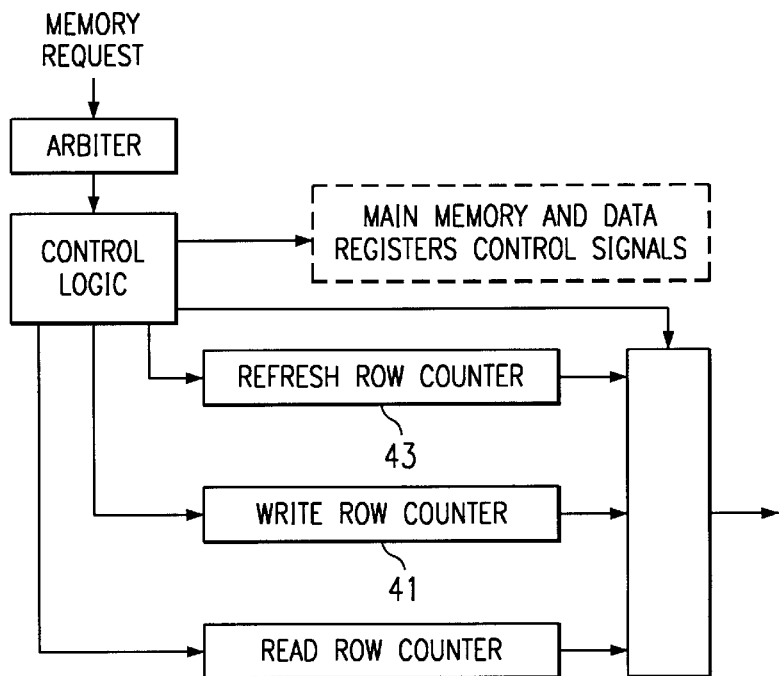
FIG. 8 shows a memory access arrangement.

The sequencing of the central memory operations and therefore "requests" are managed by an "arbiter" (FIG. 8)—the section of a multiprocessor networks operating system capable of resolving simultaneous system-resource requests.

Each and every access to the memory array involves all the cells in the row being addressed. Although only a quarter of these cells are actually involved in the read or write operation, all cells are involved because block selectors select 1 sense-amplifier out of the 4 available, for instance FIG. 2 (25), and connect it to the local register. The row addresses are contained in 3 counters, identified on FIG. 1 and in FIG. 4 as "write row counter" (41), "read row counter" (42), and "refresh row counter" (43). The refresh row address is incremented by every refresh cycle. The read row address is incremented every 4 read cycles and similarly, the write row address is incremented every 4 write cycles, as a result of module 4 column addressing and sequential access.

The sequence of data transfer in conventional technology is problematic, for instance if stopped by the user it is not possible to re-read the final items of data written to memory since, after an RSTW occurs in write mode, it is necessary to transfer the final items of data which are still present, in the latches and flip-flops of the write pipeline, to the registers of the buffer memory. Also, it is necessary to send a "reset write" request to the arbiter, to complete the write cycle, thereby transferring the final items of data to the central memory and so enabling the user to re-read all the data (TND=Total Number of Data) written between the two proceeding RSTW's.

Therefore, employing typical conventional technology, it is necessary for a number of clock shots to follow the RSTW to complete the write cycle. The number of clock shots depending upon TND module 4, that is the state of the write pipeline on arrival of the RSTW.

For example, if the user stopped, or used the WE to disable, the SWCK after an RSTW but prior to completion of the current write cycle, it would not then be possible to re-read the final items of data written to memory and data would be lost.

Figure 6A:
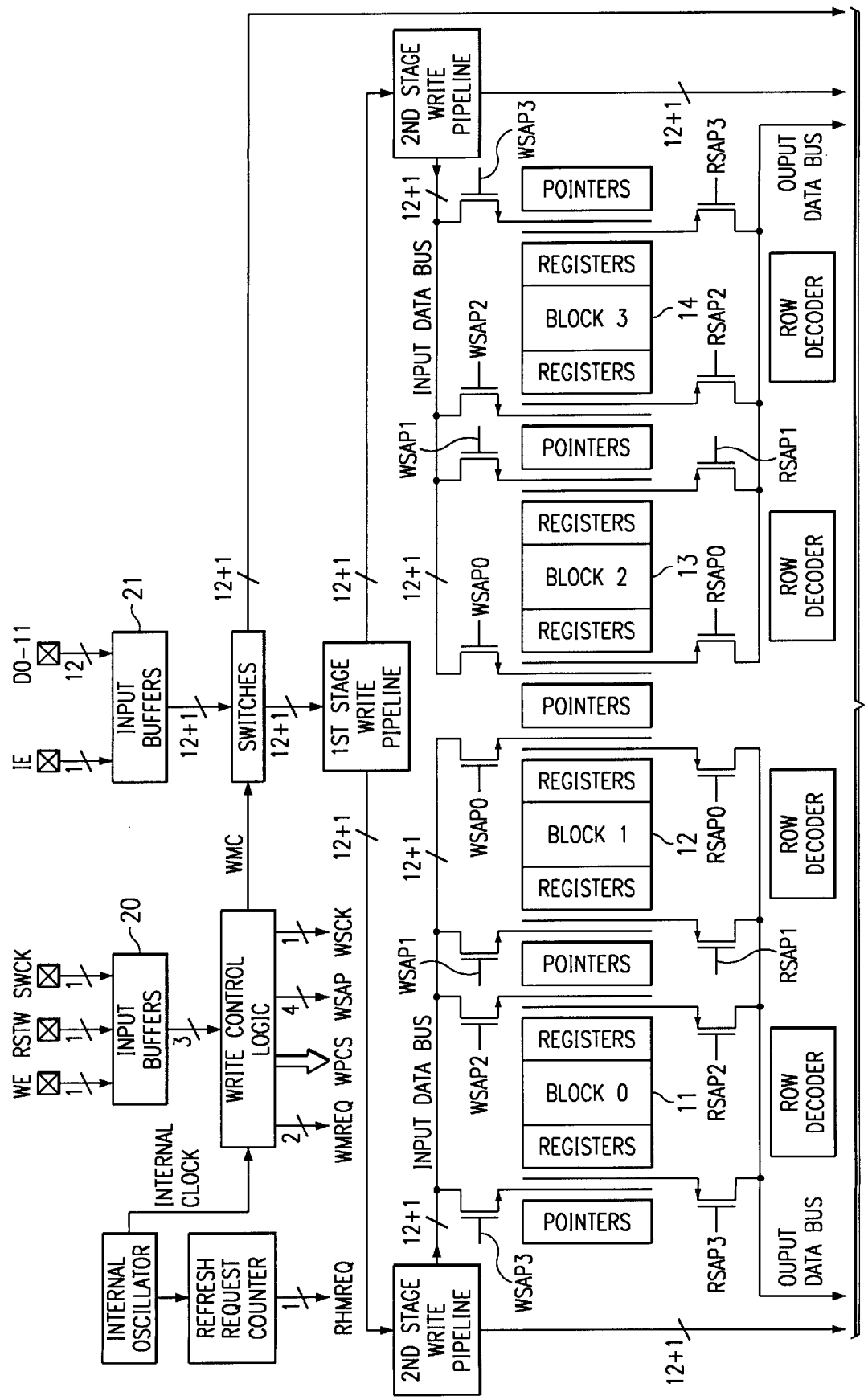
FIG. 6 shows an FMEM with a cache memory.
Figure 6B:
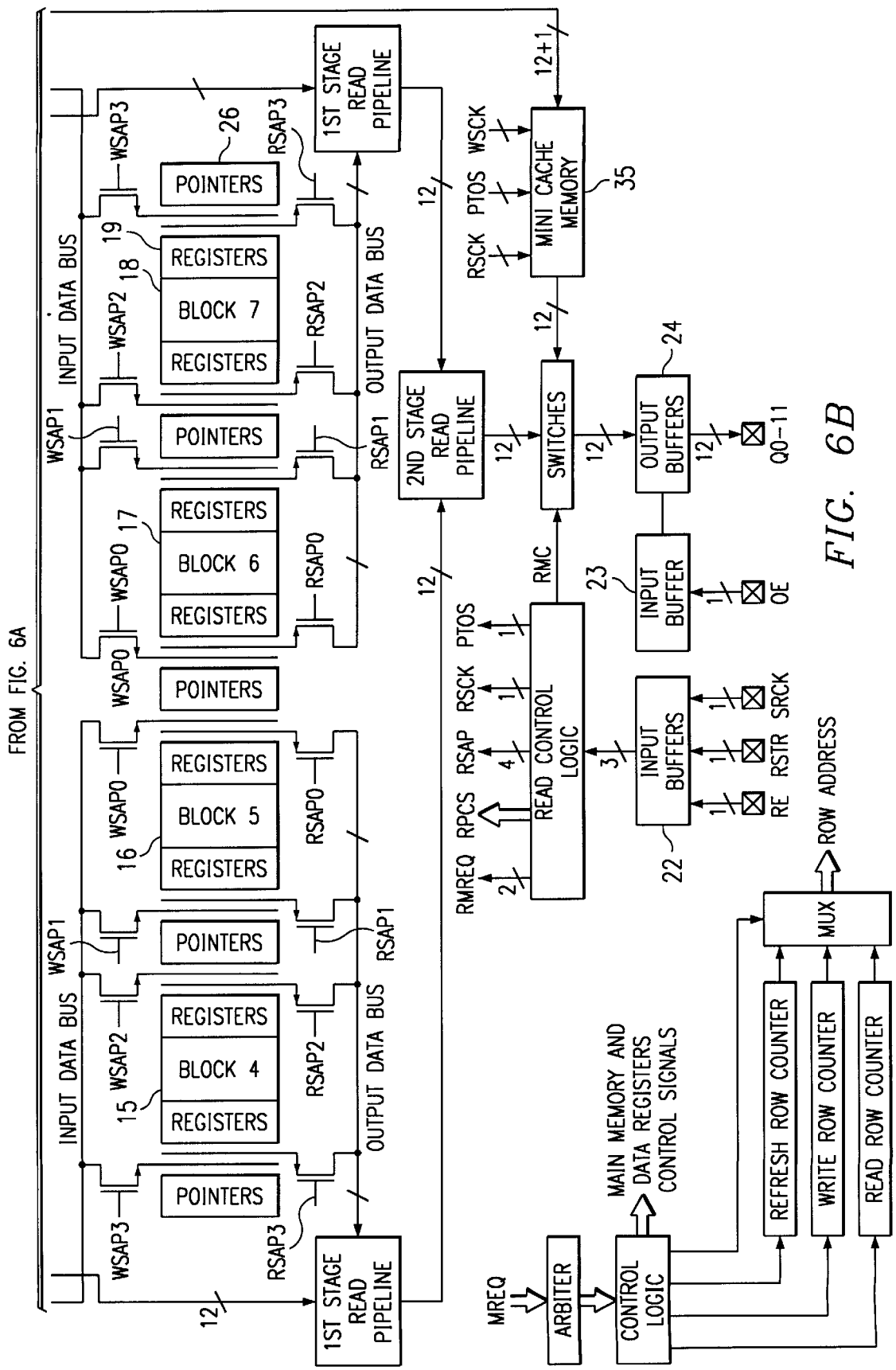

The mini-cache memory, FIG. 6 (35), consists, for example of 12 identical units, one for each bit of the word. Physically located in proximity of the output buffers, each consists of 2 shift registers, one for the write and one for the read mode. It is configured as a closed loop and NC (Number of Cells) cells in length.

Figure 7A:
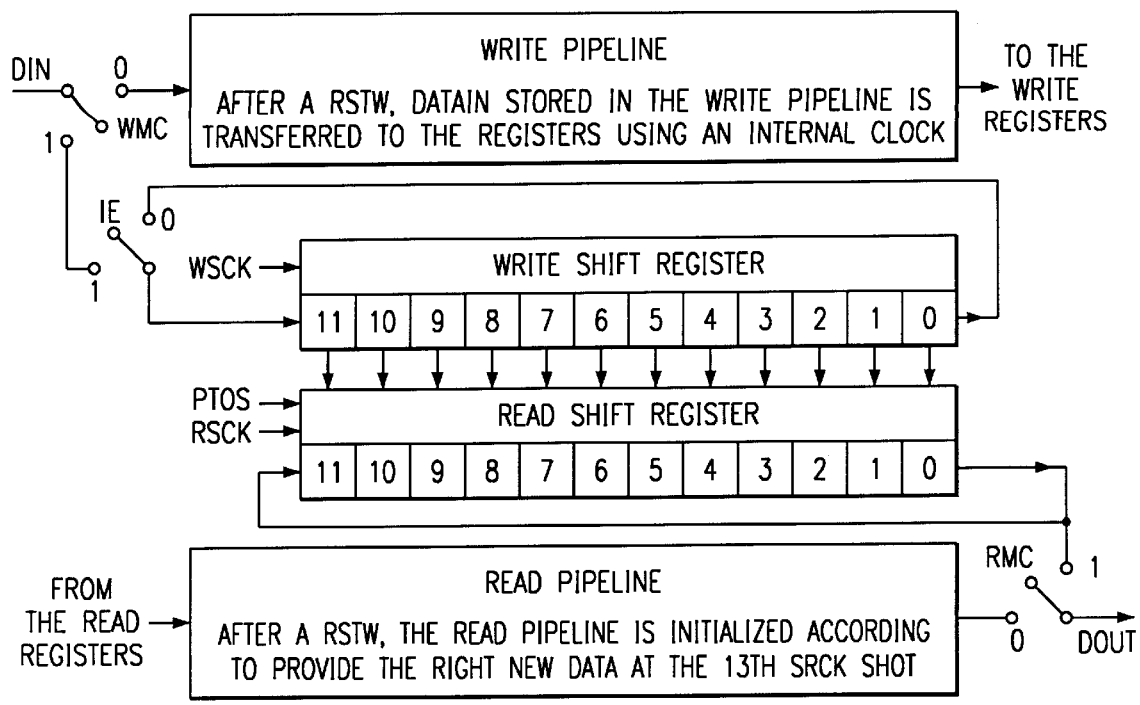
FIG. 7 shows a cache memory with timing diagrams.

The mini-cache is a dedicated local memory, activated after a reset operation for an NC number of clock shots. FIG. 7 is a diagram of the logic (7-1) detailing the principle on which the mini-cache operates, together with timings for the write (7-2) and read (7-3) cycles.

After an RSTW, independently of the SWCK, the write operation is completed as a conventional sequence, but using an internal clock which momentarily takes over from the SWCK.

The first NC new items of data following the RSTW, synchronised by the SWCK, are stored in the write shift register of the mini-cache. Subsequent data being directed to the write pipeline, previously initialised and in synchronisation with SWCK.

To ensure that the write cycle of the internal clock is completed, which it must be for successful operation, before new data arrives in the write pipeline, the product of the number of cells (NC) of the shift register, for the Serial Write Clock Minimum Period (SWCKMP), must be greater than the product for the Internal Clock Maximum Period (ICMAXP). This function is for the maximum number of clock shots required, after an RSTW, to complete the write cycle. Where CKSMN expresses the Clock Shot Maximum Number, this can be stated as:

NC×SWCKMP>IC14AXP×CKSMN

In the example NC is equal to 12.

In the buffer memory, in addition to the normal master and slave registers for sequential operation, there are also 8×12 master registers forming the cache-memory. This cache-memory stores the input data from NC+1 to NC+80, the result of which is that the first 80 words are immediately available, without having to wait for read access to the array, which is however necessary for the subsequent 80 words.

After loading of the mini-cache and cache memories and after, n-t least, NC SRCK shots following the last RSTR, the data previously loaded into the write shift register are transferred, in parallel, to the read shift register. The loading of the cache memory is with a normal access cycle, and following at least NC SRCK cycles after the RSTR, the data, previously loaded to the write shift register is transferred in parallel to the read shift register in response to a PTOS (Parallel Transfer One-Shot) signal.

In response to an RSTR, the first data, which is stored in the read shift registers, are immediately available to supply the output buffers.

After an RSTR a "read reset" request is sent to the arbiter, initialising three prime response with the effect of transferring the 80 words held in the cache memory to the slaves of the read registers, initialising the Read Row Counter, and performing a read access to the array in order to load the subsequent 80 words into the masters of the read registers.

During the first NC shots of the SRCK, following an RSTR and including the shot that triggered it, the new data are read from the read shift register of the mini-cache memory excluding the read pipeline. In the meantime the read pipeline is initialised giving the opportunity at the end of the relevant time, for having successive data, which was previously loaded from the cache memory, available at the NC+1th shot of the SRCK; that is, available when data are again issuing from the read pipeline. Utilising this methodology, it will be apparent that the undesirable drawback of delay introduced by the pipeline of the prior art is overcome.

In operation, when a write reset (RSTW) occurs (FIG. 7-2) WMC goes high such that data appearing at the D-IN input enters the write shift register directly. This allows existing data in the write pipeline to be clocked by the internal clock WSCK to the write registers.

This data may be read by initiating a direct transfer (PTOCS) to the read shift register of the mini-cache, and with RMC high this data appears at the output (D-OUT). It will be observed that there is no need to wait for the read pipeline to fill before output data is available. The arrangement is such that the read pipeline is full on the thirteenth (NCH) cycle after the read reset (RSTR) so that the system synchronises to normal operation once the data from the mini-cache has been read.

Table for FIG. 1

| | |
|---|---|
| MREQ | Memory Request |
| WMREQ | Write Memory Request (Reset and Sequential) |
| RHMREQ | Refresh Memory Request |
| RMREQ | Read Memory Request (Reset and Sequential) |
| WPCS | Write Pipeline Control Signals |
| RPCS | Read Pipeline Control Signals |
| WMC | Write Mini-Cache |
| WSCK | Write Shift-Clock |
| PTOS | Parallel Transfer One shot |
| RMC | Read Mini-Cache |
| RSCK | Read Shift Clock |

Table for FIG. 5

| | |
|---|---|
| BLKSEL | Block Select |
| WOP | Write Operation |
| WM | Write Memory |
| WAP | Write Address Pointer |
| RAP | Read Address Pointer |
| RM | Read Memory |

Table for FIG. 7

| | |
|---|---|
| WMC | Write Mini-Cache |
| WSCK | Write Shift Clock |
| PTOS | Parallel Transfer One Shot |
| RSCK | Read Shift Clock |
| RMC | Read Mini-Cache |
| RSTR | Read Reset |
| RSTW | Write Reset |

-continued

Table for FIG. 7

| | |
|---|---|
| D-IN | Data In |
| D-OUT | Data Out |
| TND | Total Number of Data between consecutive RSTW's |

We claim:

1. A field memory comprising:
a set of input pads for receiving input data and a set of output pads for sending data out;
a plurality of memory blocks having two banks of registers associated with each memory block allowing parallel access to each block in read and write operations each storing at least one bit of data, each of said blocks having a separate read register and write register;
a write pipeline circuit for transferring the input data to the memory blocks, the write pipeline configured to receive words sequentially a word at a time at each cycle of a serial write clock from the input pads and pass the input data to the write registers of the banks of registers;
a read pipeline circuit with a command signal for transferring into the slave registers data read previously from the memory blocks into the master registers, the read pipeline configured to serialize the data in the master registers and send the data sequentially to the output pads with each cycle of a serial read clock.

2. The memory of claim 1 further comprising an arbiter circuit to prevent conflicts between asynchronous read and write operations of the memory.

3. The memory of claim 1 wherein the memory blocks are divided into mini-arrays and wherein the bits of the input data word are not stored in adjacent locations in the mini-arrays but are partitioned into smaller groups of bits and stored in the memory block.

4. The memory of claim 3 further comprising a cache memory for storing a first plurality of bits in said pipeline and for providing said first plurality of bits directly to an output of the memory while the pipeline is being filled from said read register.

5. The memory of claim 1 further comprising an input enable circuit which defines whether bits of a word are to be written into a memory block or not based upon an input enable bit associated with each word.

6. The memory of claim 1 further comprising a cache memory for storing a first plurality of bits in said pipeline and for providing said first plurality of bits directly to an output of the memory while the pipeline is being filled from said read register.

7. A field memory comprising:
a set of input pads for receiving input data and a set of output pads for sending data out;
a plurality of memory blocks having two banks of registers associated with each memory block allowing parallel access to each block in read and write operations, and wherein each of said read and write registers is a master-slave register;
a write pipeline circuit for transferring the input data to the memory blocks, the write pipeline configured to receive words sequentially a word at a time at each cycle of a serial write clock from the input pads and pass the input data to the write registers of the banks of registers, the write pipeline includes a command line to transfer the data from the master registers to the slave registers;
a read pipeline circuit with a command signal for transferring into the master/slave registers data read previously from the memory blocks into the master/slave registers, the read pipeline configured to serialize the data in the master registers and send the data sequentially to the output pads with each cycle of a serial read clock; and
an arbiter circuit to prevent conflicts between the asynchronous serial read clock and the serial write clock.

8. The memory of claim 7 wherein said memory blocks are divided into mini-arrays separated by sense amplifiers and flanked on either side by the read/write registers.

9. The memory of claim 8 wherein the bits of the input data word are not stored in adjacent locations in the mini-arrays but are partitioned into smaller groups of bits and stored in the memory block.

10. The memory of claim 7 further comprising an input enable circuit which determines whether bits of a word are to be written into a memory block or not based upon an input enable bit associated with each word.

11. The memory of claim 7 wherein said input pads are placed alternating with said output pads in such a way that the input data lines and the output data lines for at least one of the registers do not cross over each other.

12. The memory of claim 7 further comprising a mini-cache memory comprising a set of registers dedicated to each bit of the word to store a first group of words after a Reset Write operation, and to immediately provide to the output a first group of words after a Reset Read operation without waiting for the read pipeline latency.

13. A field memory comprising:
a set of input pads for receiving input data and a set of output pads for sending data out, wherein said input pads are placed alternating with said output pads in such a way that the input data lines and the output data lines for at least one of the registers do not cross over each other;
a plurality of memory blocks having two banks of registers associated with each memory block allowing parallel access to each block in read and write operations, wherein said memory blocks are divided into mini-arrays of DRAM type technology memory separated by sense amplifiers and flanked on either side by the read/write registers, and wherein each of said read and write registers is a master-slave register;
a write pipeline circuit for transferring the input data to the memory blocks, the write pipeline configured to receive words sequentially a word at a time at each cycle of a serial write clock from the input pads and pass the input data to the write registers of the banks of registers, the write pipeline includes a command line to transfer the data from the master registers to the slave registers;
a read pipeline circuit with a command signal for transferring into the master/slave registers data read from the memory blocks into the master/slave registers, the read pipeline configured to serialize the data in the master registers and send the data sequentially to the output pads with each cycle of a serial read clock;
an arbiter circuit to prevent conflicts between the asynchronous serial read clock and the serial write clock; and
a mini-cache memory comprising a set of registers dedicated to each bit of the word to store a first group of words after a Reset Write operation, and to immediately provide to the output a first group of words after a Reset Read operation without waiting for the read pipeline latency.

* * * * *